(12) United States Patent
Takada et al.

(10) Patent No.: US 6,177,846 B1
(45) Date of Patent: Jan. 23, 2001

(54) RING OSCILLATOR TYPE VOLTAGE CONTROLLED OSCILLATOR

(75) Inventors: Shuichi Takada, Kawasaki; Akihiko Yoshizawa, Yokohama, both of (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/299,072

(22) Filed: Apr. 26, 1999

(30) Foreign Application Priority Data

Apr. 27, 1998 (JP) .................................................. 10-116731

(51) Int. Cl.[7] .......................................................... H03K 3/02
(52) U.S. Cl. .............................. 331/57; 331/1 A; 331/74; 327/261; 327/269; 327/270
(58) Field of Search ..................................... 327/269, 270, 327/261; 331/57, 1 A, 34, 74

(56) References Cited

U.S. PATENT DOCUMENTS 5,544,203    8/1996   Casasanta et al. ................. 375/376

FOREIGN PATENT DOCUMENTS 5-102801    4/1993   (JP) .

Primary Examiner—Arnold Kinkead

(74) Attorney, Agent, or Firm—Oblon, Spivak, McClelland, Maier & Neustadt, P.C.

(57) ABSTRACT

A voltage controlled oscillator includes plural cascade-connected unit circuits supplied with selection signals corresponding to an oscillation frequency. Each unit circuit includes a voltage controlled delay circuit, selection circuit and adder circuit. The selection circuit has a first input terminal supplied with an output signal of the voltage controlled delay circuit and a second input terminal supplied with the selection signal. The adder circuit has a first input terminal supplied with an output signal of the selection circuit, a second input terminal supplied with a feedback signal from a next-stage one of the unit circuits and a third input terminal supplied with the selection signal. The adder circuit adds signals supplied to its first and second input terminals to form a feedback signal. The output signal of the voltage controlled delay circuit in each unit circuit is supplied to the voltage controlled delay circuit in the next-stage one of the unit circuits. The output signal of the voltage controlled delay circuit in the unit circuit selected by the selection signal is supplied to the adder circuit via the selection circuit, sequentially supplies the output signal of the adder circuit to the adder circuit in a preceding-stage one of the unit circuits and feeds back the feedback signal output from the adder circuit in the first-stage one of the unit circuits to the input terminal of the voltage controlled delay circuit of the first-stage unit circuit.

20 Claims, 10 Drawing Sheets

RING OSCILLATOR TYPE VOLTAGE CONTROLLED OSCILLATOR

BACKGROUND OF THE INVENTION

1. Field of the Invention

This invention relates to a ring oscillator type voltage controlled oscillator (VCO) particularly for obtaining a wide range oscillation frequency by changing the number of ring oscillator stages.

2. Discussion of the Background

FIG. 1 shows a conventional basic ring oscillator type voltage controlled oscillator (VCO). In the VCO, a plurality of (n) delay elements (voltage controlled delay circuits : VCDs) 11-1 to 11-n whose delay times are variably changed by a control voltage Vcont are cascade-connected. Signals of the output taps of the VCDs 11-1 to 11-n selected by selection signals M1 to Mn are output via respective selection circuits (2-input NAND gates 13-1 to 13-n) after they are inverted by inverters 12-2, . . . , 12-n when the even stages are selected and output via the respective selection circuits as they are when the odd stages are selected. The signals derived via the selection circuits 13-1 to 13-n are supplied to an adder (n-input NAND gate 14) via respective signal lines 15-1 to 15-n and an output signal of the adder 14 is fed back to the input terminal of the first-stage VCD 11-1. At this time, if the number of inverting circuits (inverters or NAND gates for effecting the inverting operation) in the ring oscillator is odd, the feedback loop is a positive feedback loop and the oscillating operation is sustained.

The frequency of an oscillation output Fout output from the NAND gate 14 can be adjusted by the delay time of each VCD stage which is adjusted by the control voltage Vcont and the number of stages of the VCDs 11-1 to 11-n selected by the selection signals M1 to Mn. As shown in FIG. 2, a VCO having a wide variable range can be constructed by superposing the range of the oscillation frequency which can be variably changed by the control voltage Vcont over the range of the oscillation frequency obtained by adjusting the number of VCD stages.

In order to attain the continuous oscillation of the ring oscillator, it is necessary to set the feedback loop of the ring oscillator as a positive feedback loop. For this purpose, when the output signal of one of the even-stage VCDs 11-2, . . . , 11-n is selected, it is necessary to first pass the output through a corresponding one of the inverters 12-2, . . . , 12-n and then input the output to a corresponding one of the selection circuits 13-2, . . . , 13-n so as to always feed back the positive feedback signal to the input terminal of the first-stage VCD 11-1. Therefore, when the number of VCD stages is even, it is necessary to add one inverter to the feedback circuit in comparison with a case of an odd number of VCD stages.

For example, if one VCD stage is added to change the oscillation frequency, the number of inverter circuits in the ring oscillator is not simply increased by one VCD stage, but the inverter is added or not added according to whether the number of VCD stages is even or odd and the number of inverters is irregular. Further, in the case of an even number of stages, the delay time of one stage of the inverter is added in the loop of the ring oscillator. Since the additional delay time of the inverter varies depending on the fluctuation in the manufacturing process, a variation in the power supply voltage and a variation in the temperature, the range of the oscillation frequency which can be varied by the control voltage Vcont and the range of the oscillation frequency obtained by adjusting the number of VCD stages may be deviated from each other. If a deviation between the oscillation frequency ranges occurs, the oscillation frequency cannot be continuously changed. Therefore, in order to prevent occurrence of a deviation between the oscillation frequency ranges, the range (oscillation gain) of the oscillation frequency which can be varied by the control voltage Vcont is increased in the prior art. However, if the oscillation gain is increased, jitters (fluctuation in the frequency) of the oscillation frequency by noises and the fluctuation in the control voltage Vcont are increased and it is not a desirable method.

If the number of VCD stages is selectively changed in n different manners, it is necessary to provide the n-input adder circuit 14 for adding together n delay signals output from the output taps of the VCDs 11-1 to 11-n and n signal lines 15-1 to 15-n for supplying the output signals from the output taps to the adder circuit 14. In this case, if the number n of signals to be added increases, the circuit scale of the adder circuit 14 increases and the delay time occurring in the adder circuit 14 becomes longer. Since the wiring lengths of the n signal lines 15-1 to 15-n from the output taps of the VCDs to the adder circuit 14 are different from one another, the delay times due to the wiring capacitances become different according to the number of VCD stages. Therefore, if the number of VCD stages is changed or the number of switchings of the number of stages is changed, a troublesome operation which is substantially equal to the re-designing for changing the input numbers of the adder circuit 14 and adequately setting the wiring lengths of the signal lines 15-1 to 15-n from the output taps of the VCDs 11-1 to 11-n to the adder circuit 14 is required.

As described above, in the conventional ring oscillator type voltage controlled oscillator, there occurs a problem that the range of the oscillation frequency which can be varied by the control voltage and the range of the oscillation frequency obtained by adjusting the number of VCD stages will be deviated from each other and the oscillation frequency becomes discontinuous. Further, if the range of the oscillation frequency which can be varied by the control voltage is increased in order to solve the above problem, there occurs a new problem that jitters of the oscillation frequency due to noise and a fluctuation in the control voltage are increased.

Further, in the conventional ring oscillator type voltage controlled oscillator, if the number of VCD stages increases, the circuit scale of the adder circuit becomes large and the delay time in the adder circuit becomes long, and the delay times become different because of a difference in the wiring capacitances from the output taps of the VCDs to the adder circuit, and if the number of VCD stages is changed or the number of switchings of the number of stages is changed, there occurs a problem that a troublesome operation substantially equal to the re-designing is required.

BRIEF SUMMARY OF THE INVENTION

Accordingly, an object of this invention is to provide a voltage controlled oscillator with a circuit construction suitable for LSI.

Further, another object of this invention is to provide a voltage controlled oscillator capable of preventing a deviation between the range of the oscillation frequency which can be varied by the control voltage and the range of the oscillation frequency obtained by adjusting the number of VCD stages and obtaining an oscillation output which is continuous in the wide frequency range.

Still another object of this invention is to provide a voltage controlled oscillator capable of increasing the oscillation frequency range without increasing a jitter of the oscillation frequency.

Another object of this invention is to provide a voltage controlled oscillator capable of easily changing the number of VCD stages and the number of switchings of the number of stages even if the number of VCD stages is increased.

The above objects can be attained by a voltage controlled oscillator comprising a plurality of cascade-connected unit circuits supplied with selection signals corresponding to an oscillation frequency, each of the unit circuits including a voltage controlled delay circuit, a selection circuit having a first input terminal supplied with an output signal of the voltage controlled delay circuit and a second input terminal supplied with the selection signal, and an adder circuit having a first input terminal supplied with an output signal of the selection circuit, a second input terminal supplied with a feedback signal from a next-stage one of the unit circuits and a third input terminal supplied with the selection signal, for adding the signals supplied to the first and second input terminals thereof to form a feedback signal, wherein the output signal of the voltage controlled delay circuit in each of the unit circuits is supplied to the voltage controlled delay circuit in the next-stage unit circuit, the output signal of the voltage controlled delay circuit in the unit circuit selected by the selection signal is supplied to the adder circuit via the selection circuit, an output signal of the adder circuit is sequentially supplied to the adder circuit in a preceding-stage one of the unit circuits and the feedback signal output from the adder circuit in the first-stage unit circuit is fed back to the input terminal of the voltage controlled delay circuit in the first stage of said unit circuits to form a positive feedback loop.

With the above construction, the number of VCD stages can be easily set by increasing or decreasing the number of cascade-connected unit circuits and switching of the number of stages can be made simply by selecting the unit circuit by use of the selection signal. Further, since the adder circuit is provided in each unit circuit, the circuit scale of the adder circuit does not become large and the delay time is not increased even if the number of VCD stages is increased. In addition, the wiring length and wiring capacitance from each of the VCDs to the adder circuit are substantially equal in each of the unit circuits and the delay time will not vary depending on the number of VCD stages. Therefore, the circuit construction is suitable for LSI, the number of VCD stages and the number of switchings of the number of stages can be easily changed and a troublesome operation is not required.

Further, since whether the inverter is added or not is not determined according to whether the number of VCD stags is even or odd and the number of inverter circuits inserted into the feedback circuit according to the number of VCD stages is regularly changed, a deviation between the range of the oscillation frequency which can be varied by the control voltage and the range of the oscillation frequency obtained by adjusting the number of VCD stages can be prevented. As a result, a continuous oscillation output in the wide frequency range can be obtained.

Further, since it is not necessary to increase the oscillation gain, a problem that the jitter of the oscillation frequency becomes large can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention, in which.

DETAILED DESCRIPTION OF THE INVENTION

Figure 1:
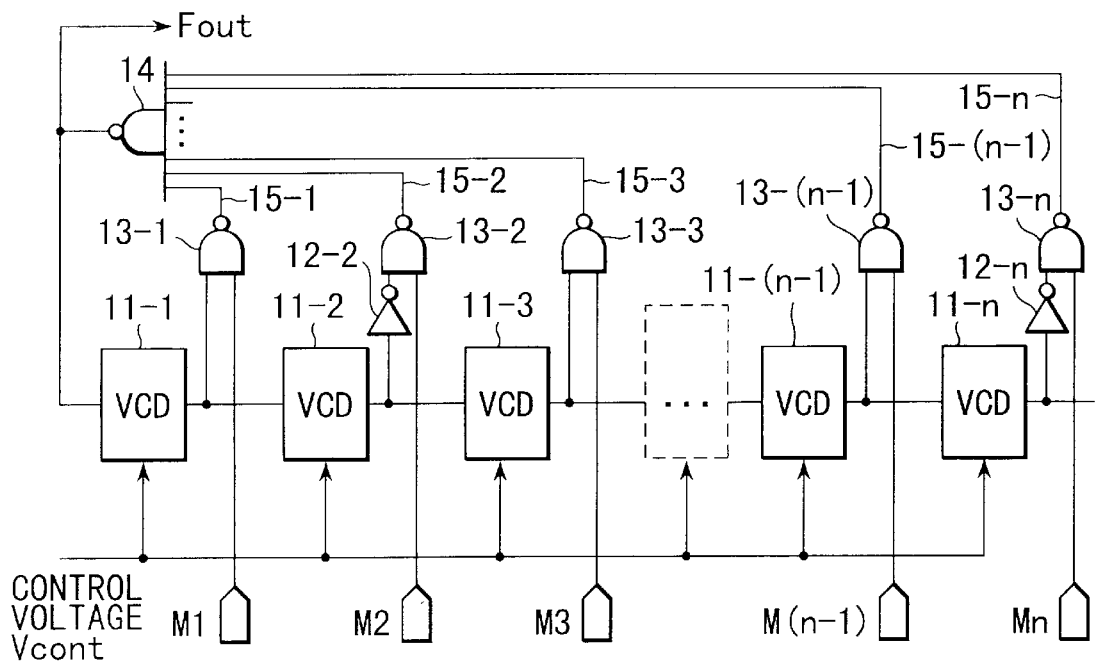
FIG. 1 is a circuit diagram showing a conventional basic ring oscillator type voltage controlled oscillator (VCO)
Figure 2:
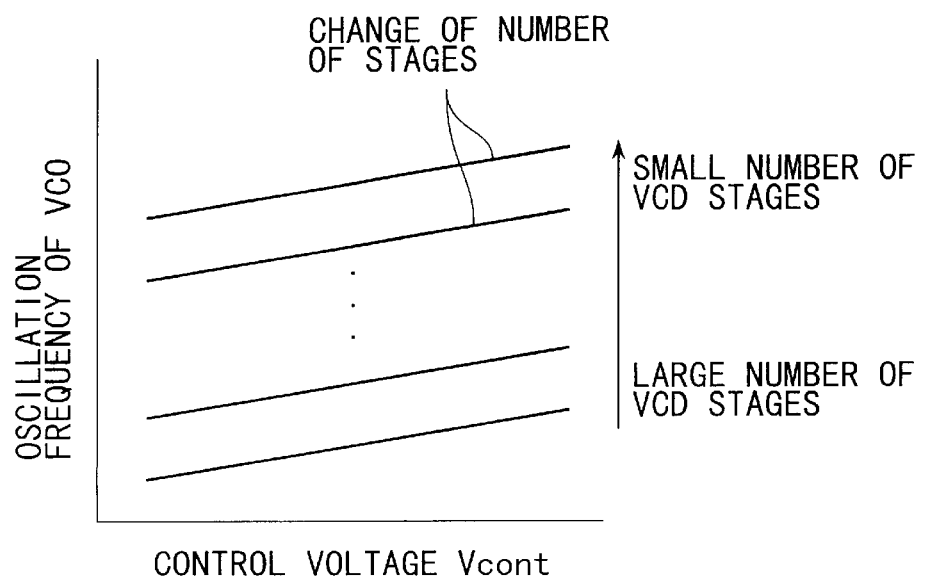
FIG. 2 is a diagram showing the relation between the control voltage and the oscillation frequency of the VCO, for illustrating a case wherein an oscillation frequency in the wide variable range is obtained in the VCO shown in FIG. 1.
Figure 3:
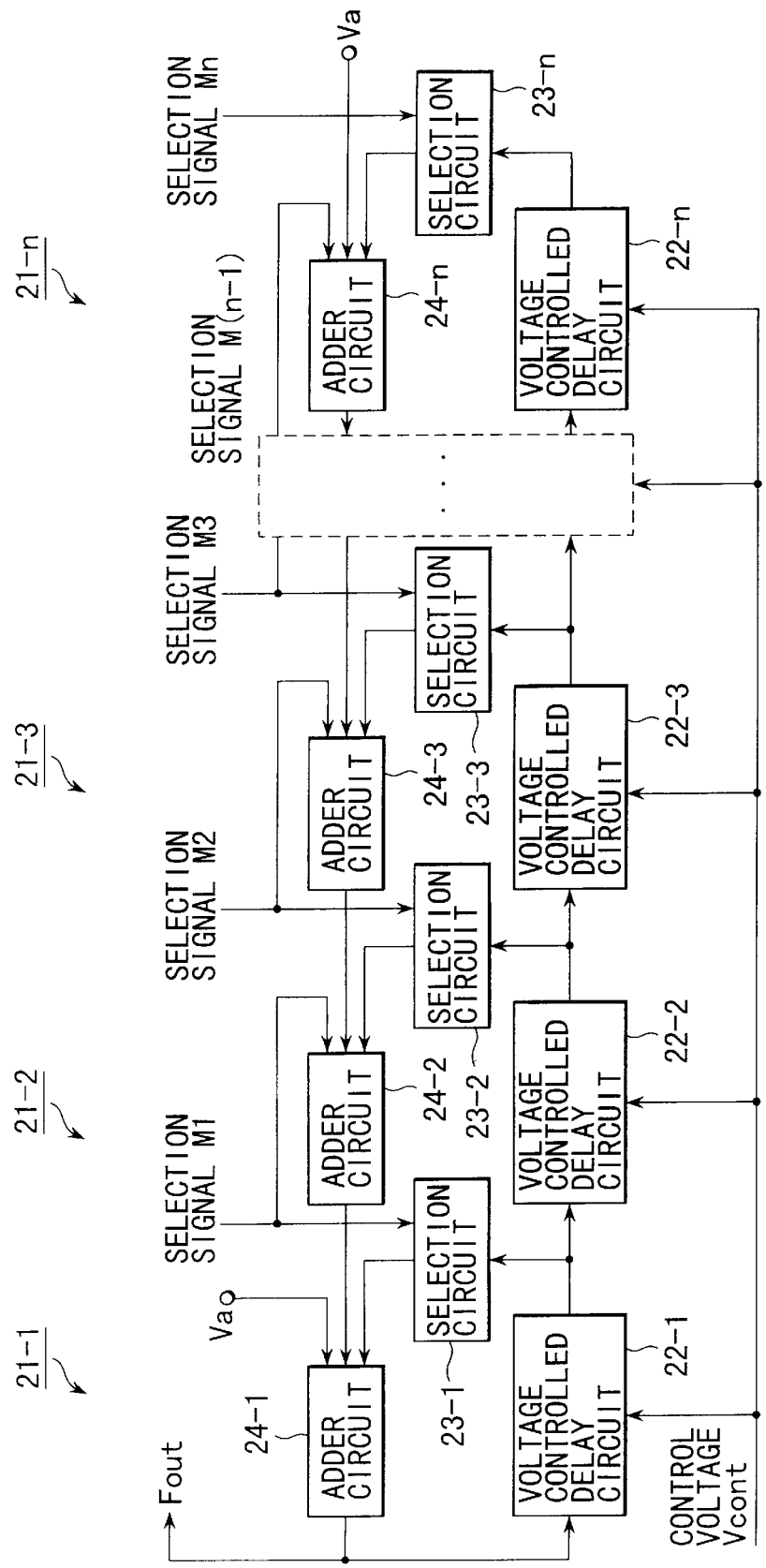
FIG. 3 is a block diagram showing the schematic construction of a voltage controlled oscillator according to a first embodiment of this invention.

FIG. 3 is a block diagram showing the schematic construction of a voltage controlled oscillator according to a first embodiment of this invention. The voltage controlled oscillator includes a plurality of (n) cascade-connected unit circuits 21-1 to 21-n. The unit circuits 21-1 to 21-n respectively include voltage controlled delay circuits 22-1 to 22-n, selection circuits 23-1 to 23-n and adder circuits 24-1 to 24-n. The voltage controlled delay circuits 22-1 to 22-n in the respective unit circuits 21-1 to 21-n are cascade-connected and the output signals of the voltage controlled delay circuits 22-1 to 22-n are respectively supplied to the first input terminals of the selection circuits 23-1 to 23-n. The second input terminals of the selection circuits 23-1 to 23-n are supplied with selection signals M1 to Mn and the output signals of the selection circuits 23-1 to 23-n selected by the selection signals M1 to Mn are supplied to the first input terminals of the adder circuits 24-1 to 24-n in the respective unit circuits 21-1 to 21-n. The output signals of the adder circuits 24-2 to 24-n are respectively fed back to the second input terminals of the adder circuits 24-1 to 24-(n–1) in the preceding-stage unit circuits 21-1 to 21-(n–1). The output signal of the first-stage adder circuit 24-1 is fed back to the input terminal of the voltage controlled delay circuit 22-1 and output as an oscillation output Fout. The second input terminal of the final-stage adder circuit 24-n is applied with a preset fixed potential Va. The third input terminal of the first-stage adder circuit 24-1 is applied with the preset fixed potential Va and the third input terminals of the adder circuits 24-2 to 24-n are supplied with the selection signals M1 to M(n–1) which are supplied to the preceding-stage unit circuits 21-1 to 21-(n–1).

With the above construction, if the unit circuit 21-2 (selection circuit 23-2) is selected by the selection signal M2, the selection circuit 23-2 is set into a state in which the output of the voltage controlled delay circuit 22-2 can be transmitted. At this time, the selection circuits 23-1, 23-3, . . . , 23-n are set into the non-selected state by the selection signals M1, M3, . . . , Mn and the outputs of the selection circuits 23-1, 23-3, . . . , 23-n are fixed. Further, the output of the adder circuit 24-3 which is the next stage of the adder circuit 24-2 is fixed by the selection signal M2 and the preceding-stage adder circuit 24-1 is set into a state in which an input signal can be transmitted. As a result, in the state in which the unit circuit 21-2 is selected by the selection signal M2, a ring oscillator is constructed by the voltage controlled delay circuits 22-1, 22-2, selection circuit 23-2 and adder circuits 24-2, 24-1 and the continuous oscillation can be attained. Likewise, if the unit circuit 21-3 (selection circuit 23-3) is selected by the selection signal M3, the selection circuit 23-3 is set into a state in which the output of the voltage controlled delay circuit 22-3 can be transmitted, and since the selection circuits 23-1, 23-2, . . . , 23-n are set into the non-selected state by the selection signals M1, M2, . . . , Mn, the outputs of the selection circuits are fixed. Further, the output of the adder circuit 24-4 which is the next stage of the adder circuit 24-3 is fixed by the selection signal M3 and the preceding-stage adder circuits 24-2, 24-1 are set into states in which an input signal can be transmitted. As a result, in the state in which the unit circuit 21-3 is selected by the selection signal M3, a ring oscillator is constructed by the voltage controlled delay circuits 22-1, 22-2, 22-3, selection circuit 23-3 and adder circuits 24-3, 24-2, 24-1 and the continuous oscillation can be attained.

A ring oscillator is constructed in the same manner as described above when one of the unit circuits succeeding the unit circuit 21-3 is selected and an oscillation frequency Fout can be attained.

Figure 4:
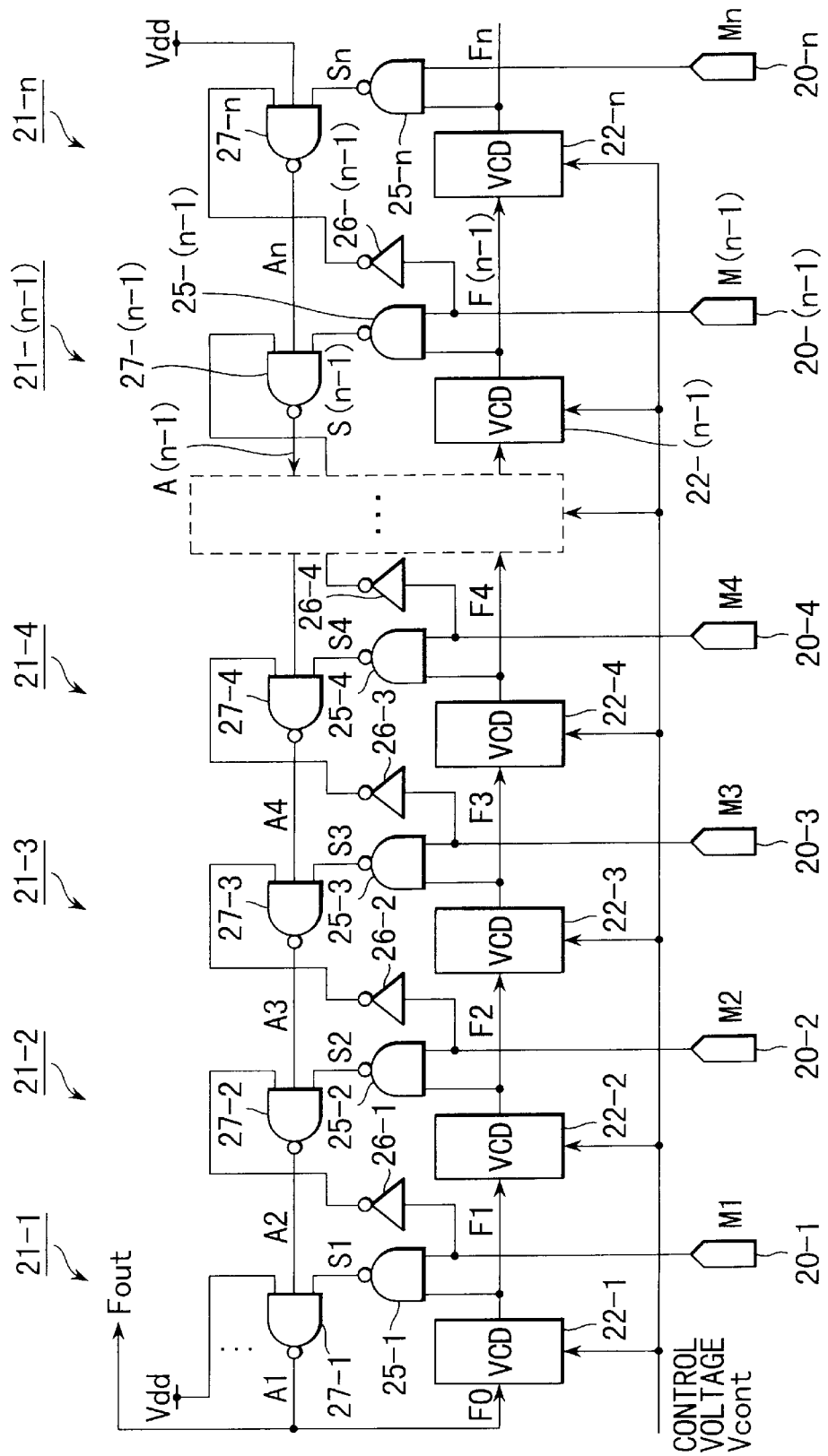
FIG. 4 is a circuit diagram for illustrating an example of the detailed construction of selection circuits and adder circuits in the circuit shown in FIG. 3.

FIG. 4 is a circuit diagram for illustrating an example of the construction of the selection circuits 23-1 to 23-n and adder circuits 24-1 to 24-n in the voltage controlled oscillator shown in FIG. 3. As shown in FIG. 4, the selection circuits 23-1 to 23-n respectively include 2-input NAND gates 25-1 to 25-n. The first input terminals of the 2-input NAND gates 25-1 to 25-n are respectively connected to the output taps of the VCDs 22-1 to 22-n and the second input terminals thereof are respectively connected to stage number switching terminals 20-1 to 20-n and supplied with the selection signals M1 to Mn. The adder circuits 24-2 to 24-n respectively include inverters 26-1 to 26-(n–1) and 3-input NAND gates 27-2 to 27-n. The first-stage adder circuit 24-1 includes a 3-input NAND gate 27-1. The input terminals of the inverters 26-1 to 26-(n–1) are respectively connected to the stage number switching terminals 20-1 to 20-(n–1). The first input terminals of the 3-input NAND gates 27-1 to 27-(n–1) are respectively connected to the output terminals of the 2-input NAND gates 25-1 to 25-(n–1), and the second input terminals thereof are respectively connected to the output terminals of the 3-input NAND gates 27-2 to 27-n in the succeeding-stage unit circuits. The third input terminals of the 3-input HAND gates 27-2 to 27-n are respectively connected to the output terminals of the inverters 26-1 to 26-(n–2) in the preceding-stage unit circuits. The third input terminal of the first-stage 3-input NAND gate 27-1 is connected to a power supply Vdd, the output terminal of the NAND gate 27-1 is connected to the input terminal of the VCD 22-1, and an oscillation output Fout is output from the output terminal of the NAND gate 27-1. Further, the first input terminal of the final-stage 3-input NAND gate 27-n is connected to the output terminal of the 2-input NAND gate 25-n, the second input terminal thereof is connected to the power supply Vdd and the third input terminal thereof is connected to the output terminal of the inverter 26-(n–1) in the preceding-stage unit circuit 21-(n–1).

Figure 5:
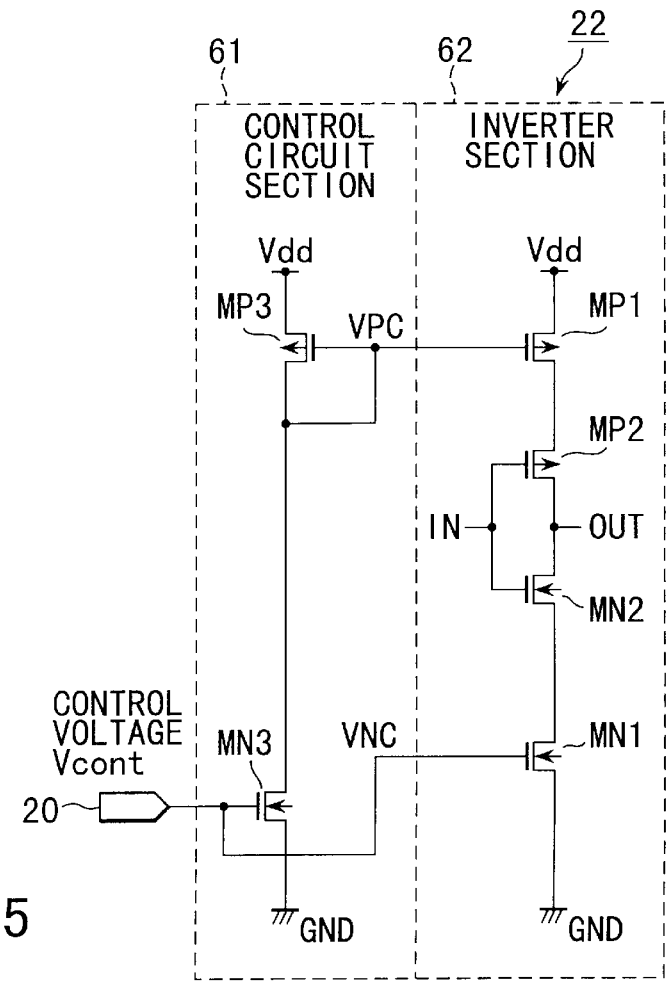
FIG. 5 is a circuit diagram showing an example of the detail construction of a voltage controlled delay circuit in the circuit shown in FIG. 4.

FIG. 5 shows an example of the detailed construction of the voltage controlled delay circuits 22-1 to 22-n shown in FIG. 4. Each of the voltage controlled delay circuits 22-1 to 22-n includes P-channel MOS transistors MP1, MP2, MP3 and N-channel MOS transistors MN1, MN2, MN3. The sources of the MOS transistors MP1, MP3 are connected to the power supply Vdd and the gates thereof are commonly connected to the drain of the MOS transistor MP3. The current paths of the MOS transistors MP2, MN2, MN1 are serially connected between the drain of the MOS transistor MP1 and a ground node GND. The gates of the MOS transistors MP2, MN2 are commonly connected, an input signal IN is supplied to the common gate connection node and an output signal OUT is output from a drain common connection node of the MOS transistors MP2, MN2. The drain of the MOS transistor MP3 is connected to the drain of the MOS transistor MN3. The source of the MOS transistor MN3 is connected to the ground node GND and the gate thereof is connected to the gate of the MOS transistor MN1 and control voltage terminal 20. The operation delay time is controlled by the control voltage Vcont applied to the control voltage terminal 20.

That is, the MOS transistors MP3, MN3 constitute a control circuit section 61, and the MOS transistors MP1, MP2, MN1, MN2 constitute an inverter section 62 in which the delay time is controlled. Internal control voltages VPC and VNC supplied from the control circuit section 61 by applying the control voltage Vcont are respectively applied to the gates of the MOS transistors MP1, MN1 for operation control so as to control the current flowing in the inverter constituted by the MOS transistors MP2, MN2. Thus, the operation delay time from the moment the input signal IN is supplied to the inverter section 62 until the time the output signal OUT is output is controlled by the control voltage Vcont.

Figure 6:
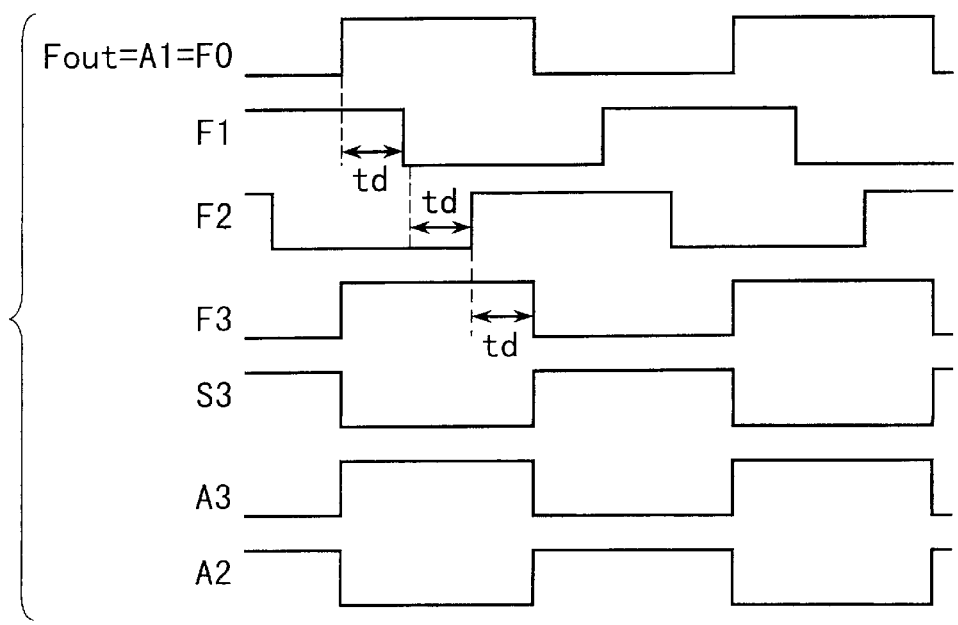
FIG. 6 is a timing chart for illustrating the operation of the voltage controlled oscillator shown in FIGS. 4 and 5.

Next, the operation of the voltage controlled oscillator with the above construction shown in FIGS. 4 and 5 is explained with reference to the timing chart of FIG. 6 by taking a case wherein the unit circuit 21-3 is selected by the selection signal M3 as an example. In this case, for brevity of the explanation, the delay times caused in the 2-input NAND gates 25-1 to 25-n and 3-input NAND gates 27-1 to 27-n are defined as "0".

A signal F0 input to the first-stage VCD 22-1 is sequentially transmitted to the VCDs 22-2 to 22-n while it is delayed by the delay time td controlled by the control voltage Vcont and signals F1, F2 and F3 are output from the output taps of the VCDs 22-1, 22-2, 22-3. The signals F1, F2, F3 are sequentially delayed by the time td with respect to a variation in the signal F0 and are signals inverted by the inverter sections 62 in the respective VCDs. When the unit circuit 21-3 is selected, the selection signal M3 is set at the "H" level and the selection signals M1, M2, M4, . . . , M(n−1), Mn are set at the "L" level. As a result, the 2-input NAND gate 25-3 acts as an inverter for inverting the output signal F3 of the VCD 22-3, outputs an inverted signal S3 of the signal F3, and output signals S1, S2, S4, . . . , SC of the 2-input NAND gates 25-1, 25-2, 25-4, . . . , 25-n are set into the fixed state of "H" level.

Further, the 3-input: NAND gate 27-3 is supplied with the signal S3 from the 2-input NAND gate 25-3, an inverted signal (set in the fixed state of "H" level) of the selection signal M2 from the inverter 26-2 of the preceding stage, and an output signal A4 (set in the fixed state of "H" level) of the succeeding-stage 3-input NAND gate 27-4, inverts the signal S3 from the 2-input NAND gate 25-3 and outputs the inverted signal.

The output signal A3 of the 3-input NAND gate 27-3 is sequentially transmitted to and inverted by the 3-input NAND gates 27-2, 27-1 and input to the first-stage VCD 22-1. As a result, a signal A2 obtained by inverting the signal A3 is output from the 3-input NAND gate 27-2 and a signal Al obtained by inverting the signal A2 is output from the 3-input NAND gate 27-1. The signal A1 is used as the input signal F0 of the first-stage VCD 22-1 and output as the oscillation output Fout.

That is, with the above construction, one of the unit circuits 22-1 to 22-n corresponding to one of the selection signals M1 to Mn supplied to the stage number switching terminals 20-1 to 20-n which is set at the "H" level is set into the selected state and the unit circuits corresponding to the selection signals of "L" level are set into the non-selected state. A ring oscillator formed in a case wherein the selection signal Mk supplied to the stage number switching terminal 20-k (k=1 to n) is selected is constructed by the voltage controlled delay circuits (VCDs) 22-1 to 22-k, the 3-input NAND gates 27-1 to 27-k used as adder circuits and the 2-input NAND gate 25-k connected to the output tap of the k-th stage VCD 22-k and used as a selection circuit. Therefore, the number of stages of all of the inverter circuits in the ring oscillator becomes (2k+1) and is always odd if k is a positive integer, and therefore, the oscillation is attained in the positive feedback loop. The oscillation frequency is controlled according to the delay times of the voltage controlled delay circuits 22-1 to 22-n controlled by the control voltage Vcont and the selecting position of the stage number switching terminals 20-1 to 20-n.

With the above construction, the number of stages of the VCDs can be easily set by increasing or decreasing the number of unit circuits cascade-connected and the stage number switching operation can be effected simply by selecting the unit circuit by the selection signal. Further, since the adder circuit is provided in each unit circuit, the circuit scale of the adder circuit is not increased and the delay time is not increased even if the number of VCD stages is increased. In addition, the wiring capacitance and wiring length from a desired one of the voltage controlled delay circuits to the corresponding adder circuit are substantially equal in each unit circuit and a problem that the delay time varies depending on the number of VCD stages does not occur. Therefore, the circuit construction suitable for LSI can be obtained, the number of VCD stages and the number of stage number switching operations can be easily changed and a troublesome operation is not necessary.

Since the number of stages of all of the inverter circuits in the ring oscillator is regularly changed, it is not necessary to consider whether or not the inverter is added according to whether the number of VCDs is even or odd, and occurrence of a deviation between the range of the oscillation frequency which can be varied by the control voltage and the range of the frequency obtained by adjusting the number of VCD stages can be prevented and a continuous oscillation output can be obtained in a wide frequency range.

Further, since it is not necessary to increase the oscillation gain, a problem that jitter of the oscillation frequency becomes large can be prevented.

Figure 7:
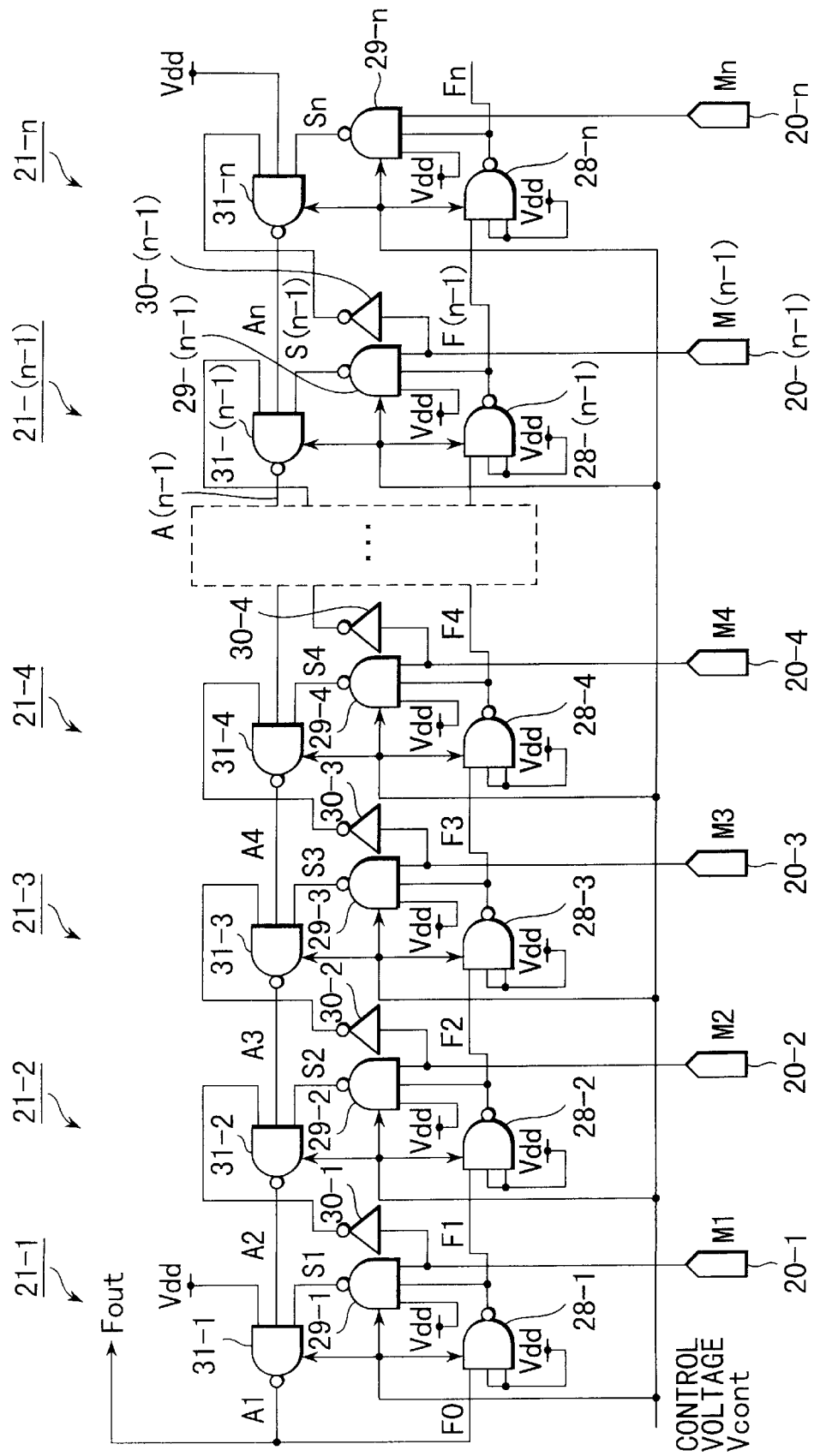
FIG. 7 is a circuit diagram showing another example of the detailed construction of the voltage controlled delay circuits, selection circuits and adder circuits in the circuit shown in FIG. 3, for illustrating a voltage controlled oscillator according to a second embodiment of this invention.

FIG. 7 shows another example of the detailed construction of the voltage controlled delay circuits, selection circuits and adder circuits in the circuit shown in FIG. 3, for illustrating a voltage controlled oscillator according to a second embodiment of this invention. The basic circuit construction is the same as that shown in FIG. 4, but in this embodiment, the voltage controlled delay circuits (VCDS) 22-1 to 22-n, selection circuits 23-1 to 23-n and adder circuits 24-1 to 24-n are constructed by voltage controlled delay circuits (which are hereinafter referred to as NVCDS) each having a 3-input NAND function. The oscillation frequency is controlled by the delay time of each NVCD controlled by the control voltage Vcont and the number of NVCD stages determined by the selecting position of the stage number switching terminals.

That is, in each of the NVCDs 28-1 to 28-n corresponding to the voltage controlled delay circuits 22-1 to 22-n shown in FIG. 3, the first and second input terminals are connected to the power supply vdd and the third input terminal thereof is connected to an output terminal of the preceding-stage NVCD. The first input terminals of the NVCDs 29-1 to 29-n corresponding to the selection circuits 23-1 to 23-n are connected to the output terminals of the NVCDs 28-1 to 28-n, the second input terminals thereof are connected to the stage number switching terminals 20-1 to 20-n and supplied with the selection signals M1 to Mn, and the third input terminals thereof are connected to the power supply vdd. Inverters 30-1 to 30-(n−1) and NVCDS 31-1 to 31-n correspond to the adder circuits 24-1 to 24-n. The input terminals of the inverters 30-1 to 30-(n−1) are respectively connected to the stage number switching terminals 20-1 to 20-n. The first input terminals of NVCDs 31-1 to 31-n are connected to the output terminals of the NVCDs 29-1 to 29-n, the second input terminals thereof are respectively connected to the output terminals of the succeeding-stage NVCDs 31-2 to 31-n and the third input terminals thereof are connected to the output terminals of the preceding-stage inverters 30-1 to 30-(n−1) which is respectively connected to the stage number switching terminals 20-1 to 20-(n−1). The output terminal of the first-stage NVCD 31-1 is connected to the third input terminal of the NVCD 28-1 and an oscillation output Fout is output from the output terminal of the first-stage NVCD 31-1. The third input terminal of the NVCD 31-1 is connected to the power supply Vdd. Further, the second input terminal of the final-stage NVCD 31-n is connected to the power supply Vdd. The operation delay times of the NVCDs 28-1 to 28-n, 29-1 to 29-n and 31-1 to 31-n are controlled by the control voltage Vcont.

Figure 8:
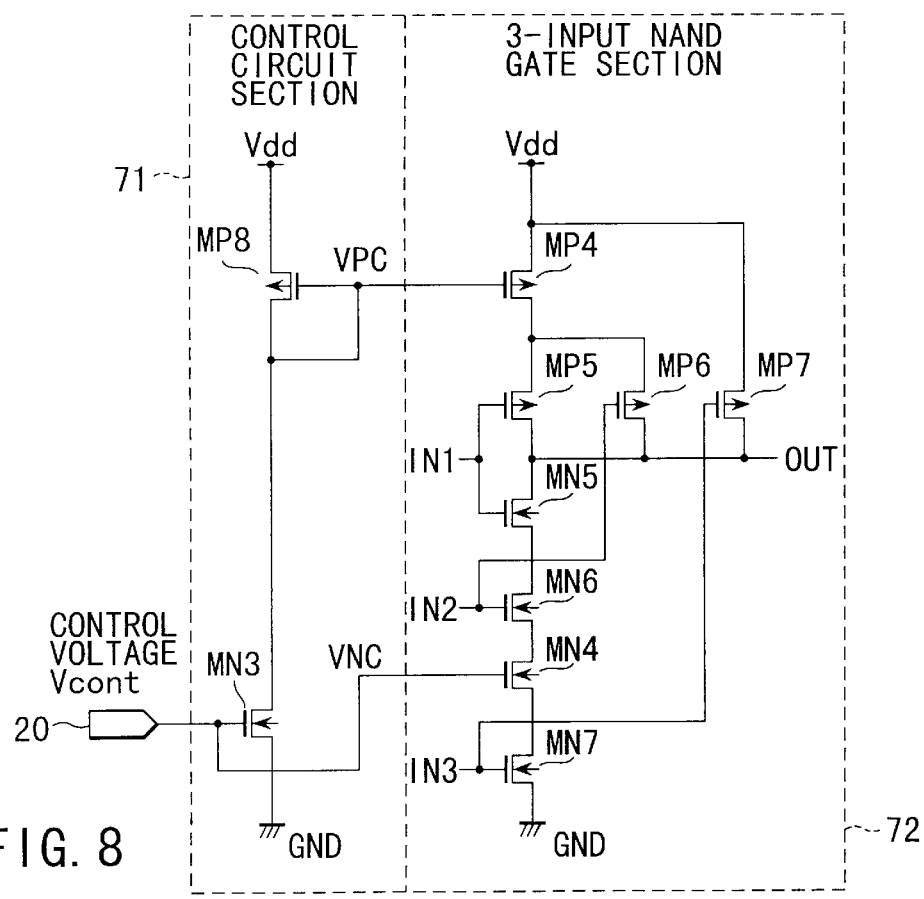
FIG. 8 is a circuit diagram showing an example of the construction of a voltage controlled delay circuit having a 3-input NAND function in the circuit of FIG. 7.

FIG. 8 shows an example of the construction of the voltage controlled delay circuit (NVCDS 28-1 to 28-n, 29-1 to 29-n and 31-1 to 31-n) having a 3-input NAND function in the circuit of FIG. 7. The voltage controlled delay circuit can be used as each of the voltage controlled delay circuits 22-1 to 22-n shown in FIG. 3, and can also be used as each of the selection circuits 23-1 to 23-n and adder circuits 24-1 to 24-n. Each NVCD includes P-channel MOS transistors MP4 to MP8 and N-channel MOS transistors MN4 to MN8. The sources of the MOS transistors MP4, MP8 are connected to the power supply Vdd and the gates thereof are commonly connected to the drain of the MOS transistor MP8. The current paths of the MOS transistors MP5, MN5, MN6, MN4, MN7 are serially connected between the drain of the MOS transistor MP4 and a ground node GND. The gates of the MOS transistors MP5, MN5 are commonly connected, a first input signal IN1 is supplied to the gate common connection node, and an output signal OUT is output from the drain common connection node of the MOS transistors MP5, MN5. The source of the MOS transistor MP6 is connected to a connection node of the drain of the MOS transistor MP4 and the source of the MOS transistor MP5 and the drain thereof is connected to the drain common connection node of the MOS transistors MP5, MN5. A second input signal IN2 is supplied to the gates of the MOS transistors MP6 and MN6. The source of the MOS transistor MP7 is connected to the power supply vdd and the drain thereof is connected to the drain common connection node of the MOS transistors MP5, MN5. A third input signal IN3 is supplied to the gates of the MOS transistors MP7, MN7. The drain of the MOS transistor MP8 is connected to the drain of the MOS transistor MN8, the source of the MOS transistor MN8 is connected to the ground node GND and the gate thereof is connected to the gate of the MOS transistor MN4 and the control voltage terminal 20. The operation delay time is controlled by the control voltage Vcont supplied to the gates of the MOS transistors MN8, MN4.

That is, the MOS transistors MP8, MN8 constitute a control circuit section 71, and the MOS transistors MP4 to MP7 and MN4 to MN7 constitute a 3-input NAND gate section 72 in which the delay time is controlled. Control voltages VPC, VNC supplied from the control circuit section 71 are respectively applied to the gates of the control MOS transistors MP4, MN4. In a case that a pulse signal is input as the first input signal IN1, a current flowing in an inverter constructed by the MOS transistors MP5 and MN5 is controlled by the control voltages VPC and VNC applied to the gates of the MOS transistors MP4, MN4 and the delay time of the output signal OUT is controlled if the second and third input signals IN2 and IN3 are used in the fixed state of "H" level. Further, in a case that a pulse signal is input as the second input signal IN2, a current flowing in an inverter constructed by the MOS transistors MP6 and MN6 is controlled by the control voltages VPC and VNC applied to the gates of the MOS transistors MP4, MN4 and the delay time of the output signal OUT is controlled if the first and third input signals IN1 and IN3 are used in the fixed state of "H" level. On the other hand, if an "L" level signal is input as the third input signal IN3, the output signal OUT is set in the fixed state of "H" level irrespective of the levels of the first and second input signals IN1, IN2.

Figure 9:
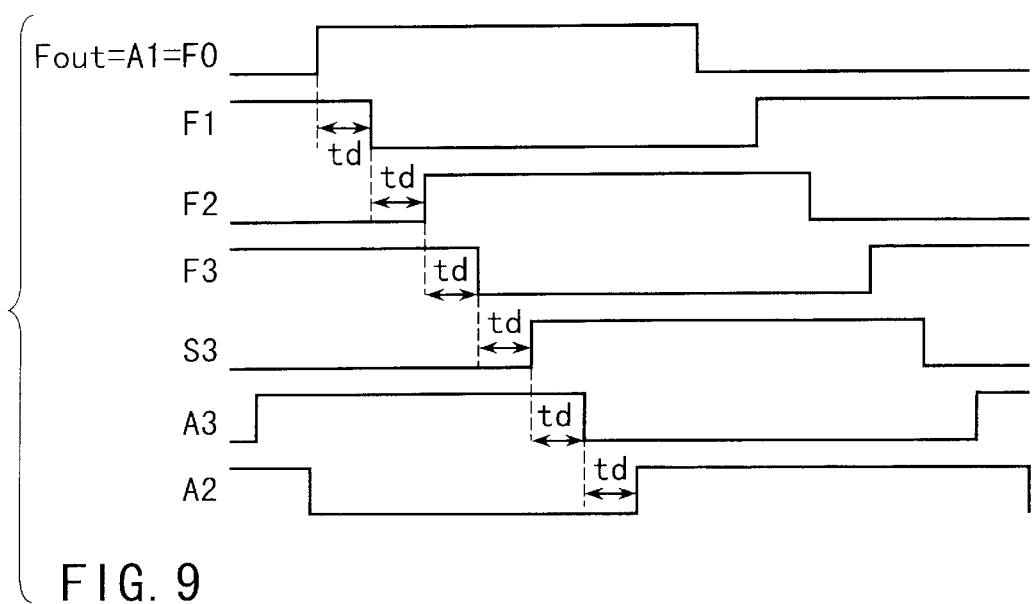
FIG. 9 is a timing chart for illustrating the operation of the voltage controlled oscillator shown in FIGS. 7 and 8.

The basic idea is explained by taking a case that the selection signal M3 supplied to the stage number switching terminal 20-3 in the circuit of FIG. 7 is selected as an example. FIG. 9 is a timing chart for illustrating the operation of the voltage controlled oscillator when the unit circuit 21-3 is selected by the selection signal M3 supplied to the stage number switching terminal 20-3. A signal F0 input to the first-stage NVCD 28-1 is sequentially transmitted to and inverted by the NVCDs 28-1 to 28-n with the delay time td controlled by the control voltage Vcont. As a result, signals F1, F2, F3 are respectively output from the NVCDs 28-1, 28-2, 28-3.

Since the selection signals other than the selection signal M3 are set at the "L" level, the outputs of the NVCDs 29-1, 29-2, 29-4 to 29-n other than the NVCD 29-3 are all set in the fixed state of "H" level. As a result, an inverted signal S3 of the signal F3 delayed by td with respect to the signal F3 is output from the NVCD 29-3.

Further, the output states of the NVCDs 31-1 to 31-n are set into states in which the output signals of the succeeding-stage NVCDS can be sequentially transmitted except that the output signal of the NVCD 31-4 which is supplied with the inverted signal ("L" level) of the selection signal M3 is set in the fixed state of "H" level. Since the NVCD 31-3 is supplied with the inverted signal of the selection signal M2 of the preceding stage and the output signal of the succeeding-stage NVCD 31-4 and both of the input signals are fixed at the "H" level, the output signal of the NVCD 29-3 can be transmitted. Signals A3, A2, A1 are respectively output from the NVCDs 31-3, 31-2, 31-1. The signal A3 is an inverted signal of the signal S3 and delayed by td with respect to the signal S3, the signal A2 is an inverted signal of the signal A3 and delayed by td with respect to the signal A3, and the signal A1 is an inverted signal of the signal A2 and delayed by td with respect to the signal A2. The signal A1 is used as the signal F0 input to the first-stage NVCD 28-1 and output as an oscillation output Fout.

With the above construction, since all of the inverter circuits in the ring oscillator are constructed by the same NVCDS, a variation in the delay time in each inverter circuit caused by a fluctuation in the manufacturing process and variations in the power supply and temperature can be further suppressed in comparison with the VCD of the first embodiment, a preferable circuit construction more suitable for LSI can be attained and the oscillation frequency can be controlled with higher precision.

Figure 10:
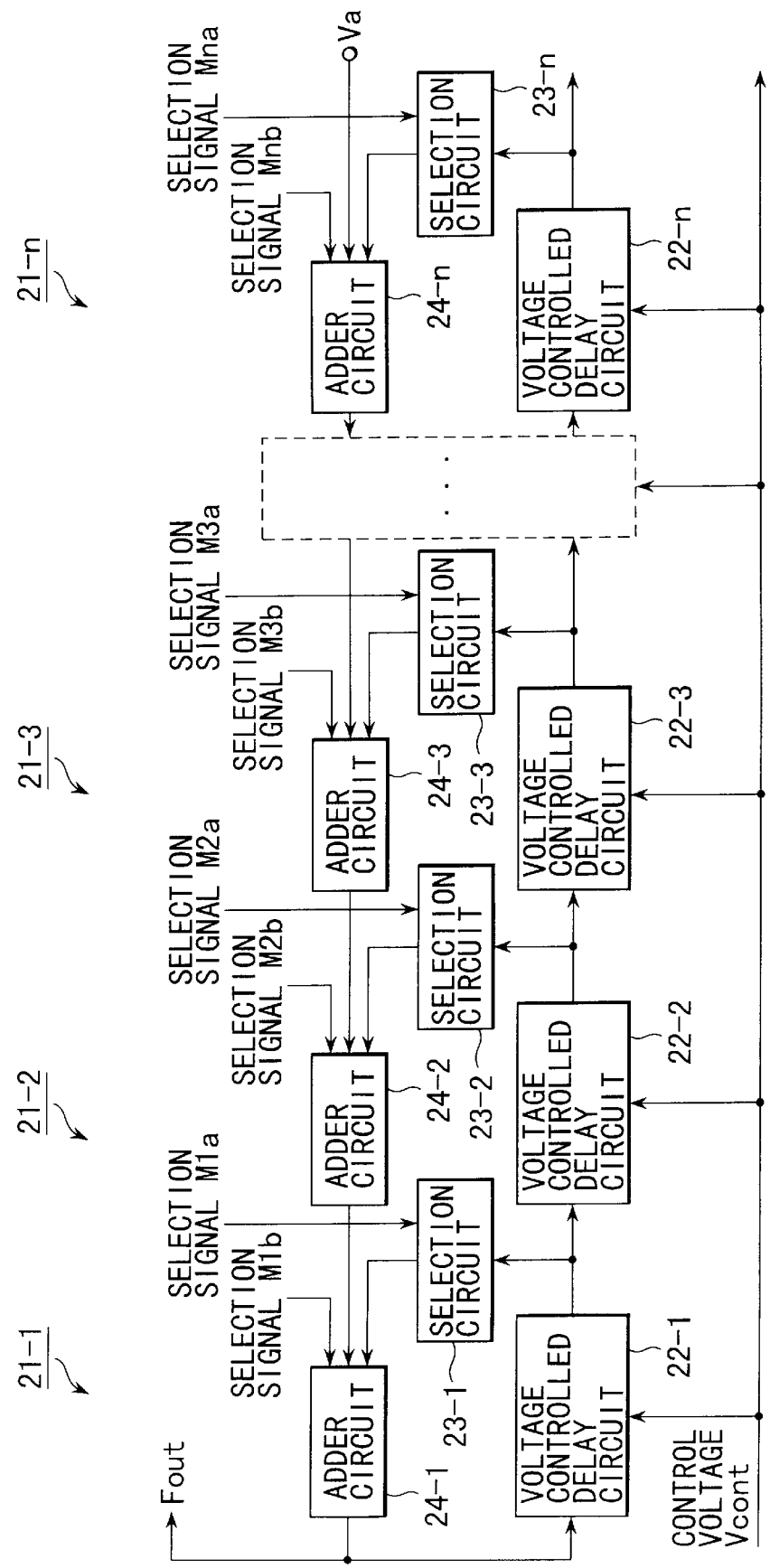
FIG. 10 is a block diagram showing an example of the schematic construction of a voltage controlled oscillator according to a third embodiment of this invention.

FIG. 10 is a block diagram showing an example of the schematic construction of a voltage controlled oscillator according to a third embodiment of this invention. In FIG. 10, portions which are the same as those of FIG. 3 are denoted by the same reference numerals and the detailed explanation thereof is omitted. In the first and second embodiments, the output signal of the adder circuit in the unit circuit is fixed by use of the selection signal in the preceding stage of the unit circuit selected by the selection signal, but in the third embodiment, the number of VCD stages is selected by selecting the selection circuits by use of first selection signals and setting the activated or deactivated states (or the fixed or non-fixed states of the output levels) of the adder circuits by use of second selection signals. That is, in the voltage controlled oscillator shown in FIG. 10, a first selection signal M1$a$ is supplied to a selection circuit 23-1 in a unit circuit 21-1 and a second selection signal M1$b$ is supplied to an adder circuit 24-1. Further, a first selection signal M2$a$ is supplied to a selection circuit 23-2 in a unit circuit 21-2 and a second selection signal M2$b$ is supplied to an adder circuit 24-2. Likewise, first selection signals M3$a$, ..., Mn$a$ are respectively supplied to selection circuits 23-3, ..., 23-n in unit circuits 21-3, 21-n and second selection signals M3$b$, ..., Mn$b$ are respectively supplied to adder circuits 24-3, ..., 24-n.

With the above construction, if the unit circuit 21-2 (selection circuit 23-2) is selected by the selection signal M2a, the selection circuit 23-2 is set into a state in which the output signal of a voltage controlled delay circuit 22-2 can be transmitted. At this time, the selection circuits 23-1, 23-3, . . . , 23-n are set into the non-selected state by the respective selection signals M1a, M3a, . . . , Mna and the output levels of the selection circuits 23-1, 23-3, . . . , 23-n are fixed. Further, the adder circuits 24-1, 24-2 are activated by the selection signals M1b, M2b and the adder circuits 24-3, . . . , 24-n are deactivated by the selection signals M3b, . . . , Mnb. As a result, in a state in which the unit circuit 21-2 is selected by the selection signals M2a, M2b, a ring oscillator is constructed by the voltage controlled delay circuits 22-1, 22-2, selection circuit 23-2 and adder circuits 24-2, 24-1 and continuous oscillation can be attained.

Likewise, if the unit circuit 21-3 (selection circuit 23-3) is selected by the selection signal M3a, the selection circuit 23-3 is set into a state in which the output signal of the voltage controlled delay circuit 22-3 can be transmitted, and since the selection circuits 23-1, 23-2, . . . , 23-n are set into the non-selected state by the respective selection signals M1a, M2a, . . . , Mna, the output levels of the selection circuits are fixed. Further, the adder circuits 24-1, 24-2, 24-3 are activated by the selection signals M1b, M2b, M3b and the adder circuits 24-4, . . . , 24-n are deactivated by the selection signals M4b, . . . , Mnb. Thus, in a state in which the unit circuit 21-3 is selected by the selection signals M3a, M3b, a ring oscillator is constructed by the voltage controlled delay circuits 22-1, 22-2, 22-3, selection circuit 23-3 and adder circuits 24-3, 24-2, 24-1 and continuous oscillation can be attained.

Even if one of the unit circuits following the unit circuit 21-3 is selected, a ring oscillator is constructed in the same manner and an oscillation output Fout can be obtained.

Like the first and second embodiments, each of the voltage controlled delay circuits 22-1 to 22-n, selection circuits 23-1 to 23-n and adder circuits 24-1 to 24-n can be constructed by a voltage controlled delay circuit having a 3-input NAND function, 2-input NAND gate or 3-input NAND gate.

Therefore, with the construction shown in FIG. 10, the same operation and the same effect as in the first and second embodiments can be attained.

Figure 11:
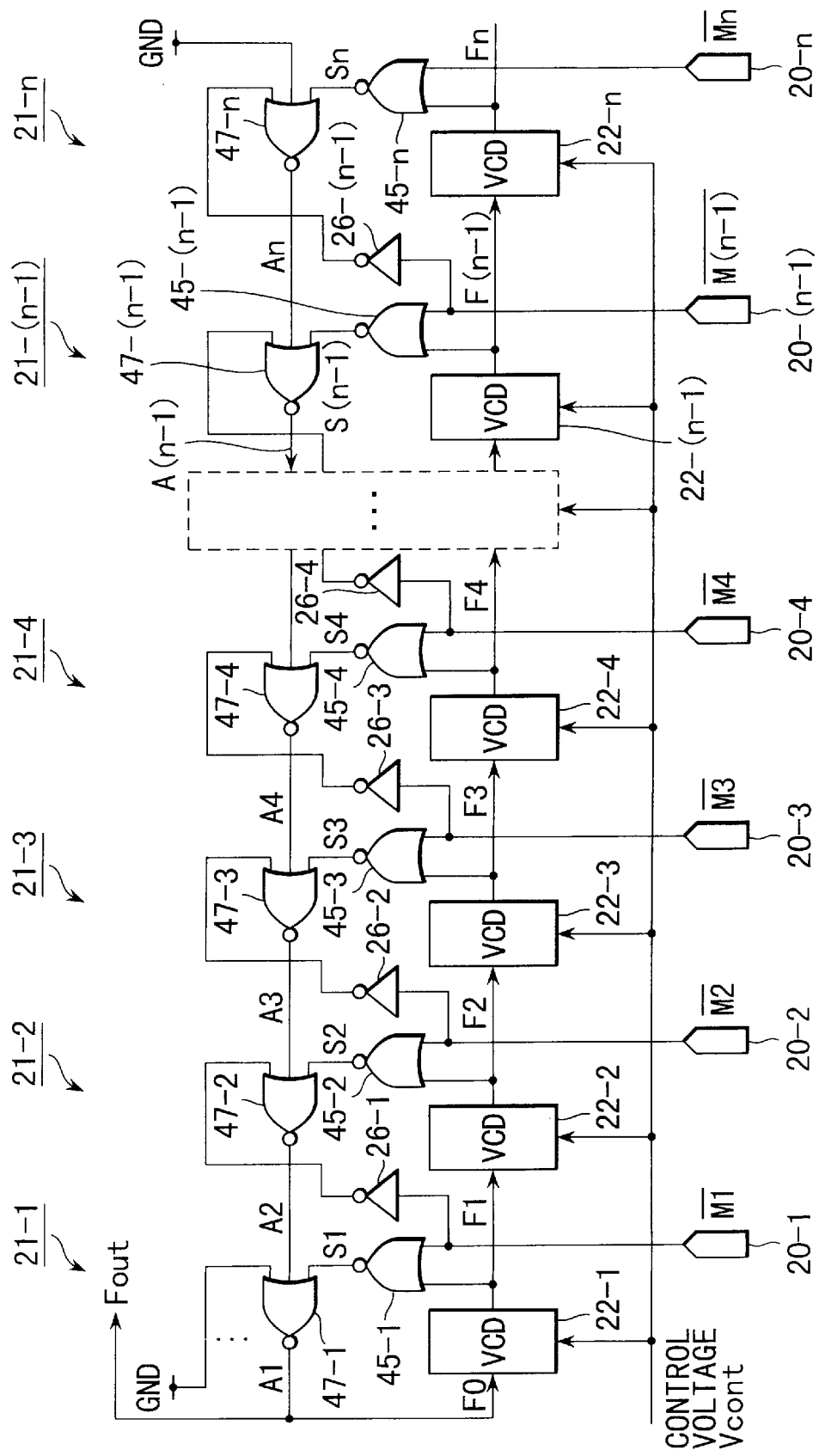
FIG. 11 is a circuit diagram showing another example of the detailed construction of the selection circuits and adder circuits in the circuit shown in FIG. 3, for illustrating a voltage controlled oscillator according to a fourth embodiment of this invention.

FIG. 11 shows another example of the detailed construction of the selection circuits 23-1 to 23-n and adder circuits 24-1 to 24-n in the circuit shown in FIG. 3, for illustrating a voltage controlled oscillator according to a fourth embodiment of this invention. The circuit of FIG. 11 is obtained by forming the circuit of FIG. 3 by use of NOR gates. That is, the selection circuits 23-1 to 23-n are respectively constructed by NOR gates 45-1 to 45-n and the adder circuits 24-1 to 24-n are respectively constructed by inverters 26-1 to 26-(n−1) and 3-input NOR gates 47-1 to 47-n. The third input terminal of the first-stage 3-input NOR gate 47-1 is connected to the ground node GND and the second input terminal of the final-stage 3-input NOR gate 47-n is connected to the ground node GND. One of the unit circuits 21-1 to 21-n which corresponds to the "L" level of the selection signals $\overline{M1}$ to $\overline{Mn}$ supplied to the stage number switching terminals 20-1 to 20-n is set into the selected state and the unit circuits corresponding to the selection signals of "H" level are set into the non-selected state. The other constructions are the same as that in the circuit of FIG. 3.

With the above logical circuit construction, substantially the same operation and the same effect as those of the first to third embodiments are attained.

Figure 12:
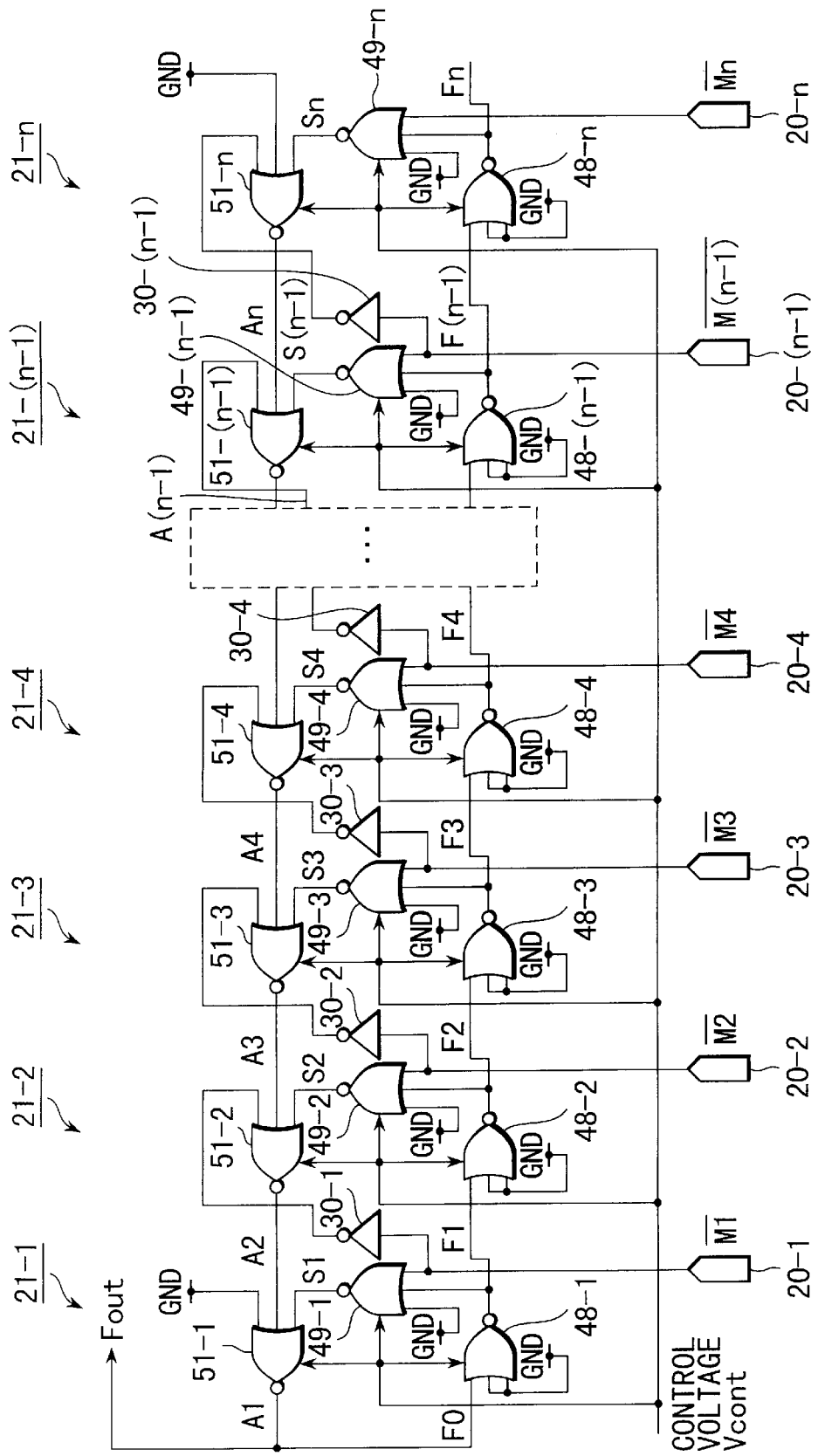
FIG. 12 is a circuit diagram showing another example of the detailed construction of the voltage controlled delay circuits, selection circuits and adder circuits in the circuit shown in FIG. 3, for illustrating a voltage controlled oscillator according to a fifth embodiment of this invention.

FIG. 12 is a circuit diagram showing another example of the detailed construction of the voltage controlled delay circuits, selection circuits and adder circuits in the circuit shown in FIG. 3, for illustrating a voltage controlled oscillator according to a fifth embodiment of this invention. In this example, the voltage controlled delay circuits (VCDs) 22-1 to 22-n, selection circuits 23-1 to 23-n and adder circuits 24-1 to 24-n shown in FIG. 3 are respectively constructed by voltage controlled delay circuits (VCDs) 48-1 to 48-n, 49-1 to 49-n and 51-1 to 51-n. Like the circuit of FIG. 11, one of the unit circuits 21-1 to 21-n which corresponds to the "L" level of the selection signals $\overline{M1}$ to $\overline{Mn}$ supplied to the stage number switching terminals 20-1 to 20-n is set into the selected state and the unit circuits corresponding to the selection signals of "H" level are set into the non-selected state. The other constructions are the same as that in the circuit of FIG. 3. Like the circuit shown in FIG. 7, the oscillation frequency is controlled by the delay time of each NVCD controlled by the control voltage Vcont and the number of NVCD stages determined by the selecting position of the stage number switching terminal.

Figure 13:
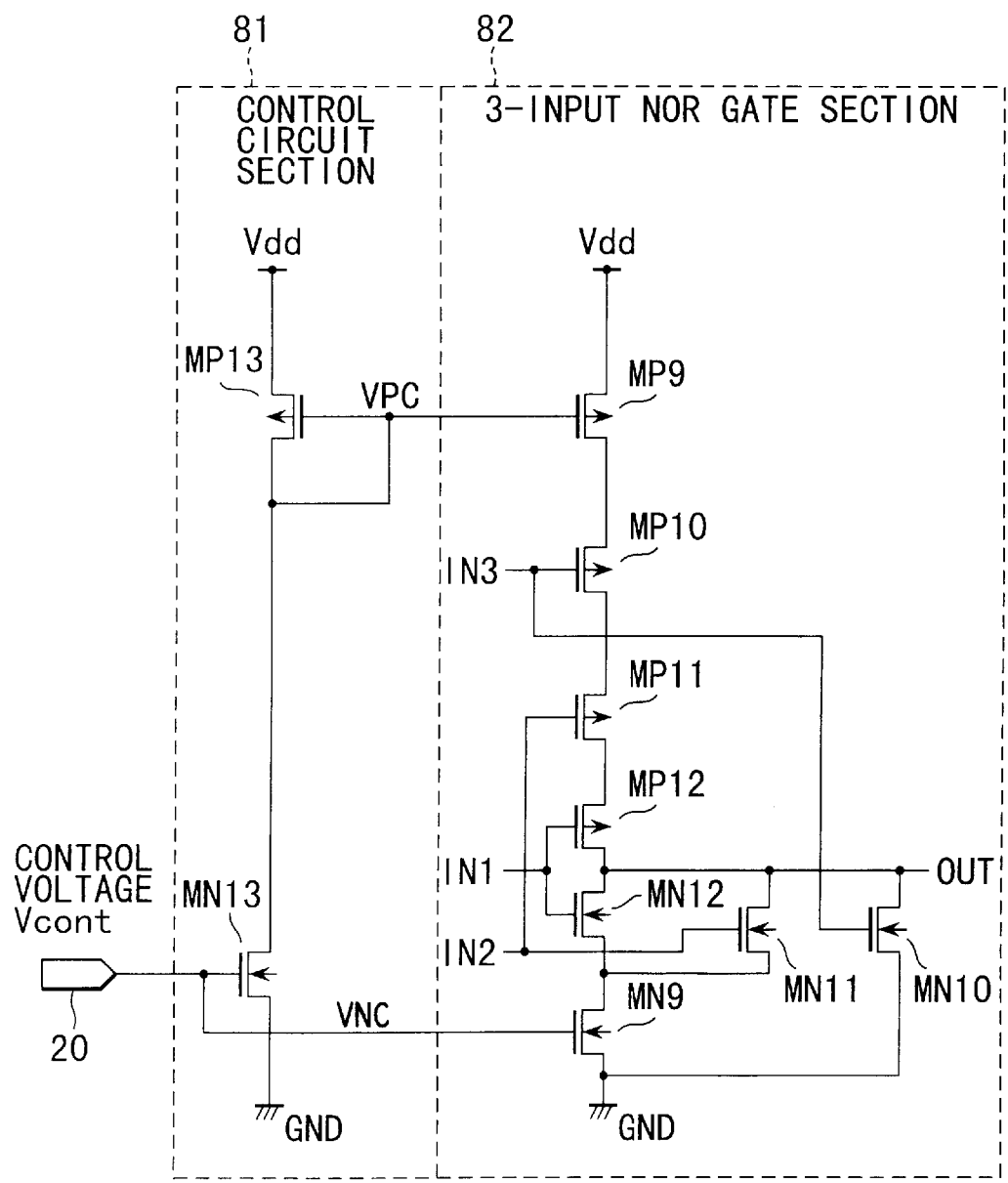
FIG. 13 is a circuit diagram showing an example of the construction of a voltage controlled delay circuit having a 3-input NOR function in the circuit of FIG. 12.

FIG. 13 shows an example of the construction of a voltage controlled delay circuit (NVCDs 48-1 to 48-n, 49-1 to 49-n, 51-1 to 51-n) having a 3-input NOR function in the circuit of FIG. 12. Each NVCD includes P-channel MOS transistors MP9 to MP13 and N-channel MOS transistors MN9 to MN13. The sources of the MOS transistors MP9, MP13 are connected to a power supply Vdd and the gates thereof are commonly connected to the drain of the MOS transistor MP13. The current paths of the MOS transistors MP10, MP11, MP12, MN12, MN9 are serially connected between the drain of the MOS transistor MP9 and the ground node GND. The gates of the MOS transistors MP12, MN12 are commonly connected, a first input signal IN1 is supplied to the gate common connection node and an output signal OUT is output from the drain common connection node of the MOS transistors MP12, MN12. The drain of the MOS transistor MN11 is connected to the drain common connection node of the MOS transistors MP12 and MN12 and the source thereof is connected to a connection node of the source of the MOS transistor MN12 and the drain of the MOS transistor MN9. A second input signal IN2 is supplied to the gates of the MOS transistors MN11, MP11. The drain of the MOS transistor MN10 is connected to the drain common connection node of the MOS transistors MP12 and MN12 and the source thereof is connected to the ground node GND. A third input signal IN3 is supplied to the gates of the MOS transistors MN10, MP10. The drain of the MOS transistor MP13 is connected to the drain of the MOS transistor MN13 whose source is connected to the ground node GND and whose gate is connected to the gate of the MOS transistor MN9 and the control voltage terminal 20. The operation delay time is controlled by the control voltage Vcont supplied to the gates of the MOS transistors MN13, MN9.

That is, the MOS transistors MP13 and MN13 construct a control circuit section 81 and the MOS transistors MP9 to MP12 and MN9 to MN12 construct a 3-input NOR gate section 82 in which the delay time is controlled. Control voltages VPC, VNC supplied from the control circuit section 81 are supplied to the gates of the control MOS transistors MP9, MN9. When a pulse signal is input as the first input signal IN1 and if the second and third input signals IN2 and IN3 are used in the fixed state of "L" level, a current flowing in the inverter constructed by the MOS transistors MP12 and MN12 is controlled by the control voltages VPC and VNC supplied to the gates of the MOS transistors MP9, MN9 and thus the delay time of the output signal OUT is controlled. Further, when a pulse signal is input as the second input signal IN2 and if the first and third input signals IN1 and IN3 are used in the fixed state of "L" level, a current flowing in the inverter constructed by the MOS transistors MP11 and MN11 is controlled by the control voltages VPC and VNC supplied to the gates of the MOS transistors MP9, MN9 and thus the delay time of the output signal OUT is controlled. On the other hand, if a signal of "H" level is input as the third input signal IN3, the output signal OUT is set into the fixed state of "L" level irrespective of the levels of the first and second input signals IN1, IN2.

Thus, when the NVCD is constructed by a circuit having a 3-input NOR function, substantially the same operation as in a case where the NVCD is constructed by a circuit having a 3-input NAND function can be attained.

As shown in FIGS. 11 to 13, even if the voltage controlled delay circuits, selection circuits and adder circuits in the circuits shown in FIGS. 4, 7 and 8 are constructed by NOR gates, only the logical operation is different and substantially the same operation and the same effect can be attained. Further, the circuit is not limited to the NAND gate and NOR gate and can be constructed by use of another circuit having the same function.

Further, as shown in the fourth and fifth embodiments, like the third embodiment, the number of VCD stages can be selected by selecting the selection circuit by use of the first selection signal and selecting the activated or deactivated state (or the fixed or non-fixed state of the output level) of the adder circuit by use of the second selection signal.

As described above, according to this invention, since the oscillation frequency is regularly changed, it is not necessary to change the number of inputs to the adder circuit and the wiring lengths from the output taps of a desired number of stages to the adder circuit are the same if a desired number of VCD stages is selected, and thus the wiring length can be easily set to an optimum value. As a result, occurrence of a deviation between the range of the oscillation frequency which can be changed by the control voltage and the range of the oscillation frequency obtained by adjusting the number of VCD stages can be prevented and a continuous oscillation output in a wide frequency range can be obtained. Therefore, it is not necessary to unnecessarily increase the oscillation gain and an oscillation output of a frequency with less jitter can be obtained.

Further, when the number of VCD stages and the number of switching steps are changed, it is only necessary to increase or decrease the number of stages of the unit circuits having the same circuit construction, an estimation of the oscillation frequency can be easily made, the design term can be shortened and the circuit construction suitable for LSI can be attained since the redundancy of the circuit is high.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage controlled oscillator comprising:
   a plurality of cascade-connected unit circuits supplied with selection signals corresponding to an oscillation frequency,
   each of said unit circuits including a voltage controlled delay circuit, a selection circuit having a first input terminal supplied with an output signal of said voltage controlled delay circuit and a second input terminal supplied with a respective one of the selection signals, and an adder circuit having a first input terminal supplied with an output signal of said selection circuit, a second input terminal supplied with a feedback signal from a next-stage one of said unit circuits and a third input terminal supplied with the respective selection signal, for adding signals supplied to the first and second input terminals of the adder circuit to form a feedback signal, wherein the output signal of said voltage controlled delay circuit in each of said unit circuits is supplied to the voltage controlled delay circuit in the next-stage one of said unit circuits, the output signal of the voltage controlled delay circuit in the unit circuit selected by the respective selection signal is supplied to said adder circuit via said selection circuit, an output signal of said adder circuit is sequentially supplied to the adder circuit in a preceding-stage one of said unit circuits and the feedback signal output from the adder circuit in a first stage of said unit circuits is fed back to the input terminal of the voltage controlled delay circuit in the first stage of said unit circuits to form a positive feedback loop.

2. The voltage controlled oscillator according to claim 1, wherein a total number of inverter circuits included in said voltage controlled delay circuit, selection circuit and adder circuit in the unit circuit selected by the respective selection signal is odd and said total number of inverter circuits constitute a ring oscillator.

3. The voltage controlled oscillator according to claim 1, wherein said voltage controlled delay circuit includes a control circuit section for outputting first and second internal control voltages according to a control voltage and an inverter section in which a current is controlled by the first and second internal control voltages output from said control circuit section.

4. The voltage controlled oscillator according to claim 3, wherein said control circuit section comprises a first transistor of a first conductivity type in which one end of a current path is connected to a first potential supply source; and second transistor of a second conductivity type in which one end of a current path is connected to the other end of the current path of the first transistor, the other end of the current path is connected to a second potential supply source and a gate receives the control voltage; and
   said inverter section comprises a third transistor of the first conductivity type in which one end of a current path is connected to the first potential supply source and a gate is connected to the gate and the other current path of the first transistor; a fourth transistor of the first conductivity type in which one end of a current path is connected to the other end of the current path of the third transistor and a gate receives an input signal; a fifth transistor of the second conductivity type in which one end of the current path is connected to the other end of the current path of the fourth transistor and a gate receives the input signal; and a sixth transistor of the second conductivity type in which one end of a current path is connected to the other end of the current path of the fifth transistor, the other end of the current path is connected to the second potential supply source and a gate is connected to the gate of the second transistor; and outputs the output signal from a connecting point between the fourth and fifth transistors.

5. The voltage controlled oscillator according to claim 1, wherein said selection circuit selects the output signal of said voltage controlled delay circuit according to the state of the respective selection signal and outputs an inverted signal thereof.

6. The voltage controlled oscillator according to claim 1, wherein said selection circuit is a 2-input NAND gate having a first input terminal supplied with the output signal of said voltage controlled delay circuit and a second input terminal supplied with the respective selection signal.

7. The voltage controlled oscillator according to claim 1, wherein said selection circuit is a 2-input NOR gate having a first input terminal supplied with the output signal of said voltage controlled delay circuit and a second input terminal supplied with the respective selection signal.

8. The voltage controlled oscillator according to claim 1, wherein said adder circuit is a 3-input NAND gate supplied with the output signal of said selection circuit, the feedback signal from the adder circuit in a next-stage one of said unit circuits and an inverted signal of the respective selection signal supplied to a preceding-stage one of said unit circuits.

9. The voltage controlled oscillator according to claim 1, wherein said adder circuit is a 3-input NOR gate supplied with the output signal of said selection circuit, the feedback signal from the adder circuit in a next-stage one of said unit circuits and an inverted signal of the respective selection signal supplied to a preceding-stage one of said unit circuits.

10. The voltage controlled oscillator according to claim 1, wherein said voltage controlled delay circuit, selection circuit and adder circuit have substantially the same circuit construction and are each formed of a circuit whose operation delay time is controlled by a control voltage.

11. The voltage controlled oscillator according to claim 10, wherein each of the circuits whose operation delay time is controlled by the control voltage includes a control circuit section for outputting first and second internal control voltages according to the control voltage and a 3-input NAND gate section in which a current is controlled by the first and second internal control voltages output from said control circuit section.

12. The voltage controlled oscillator according to claim 11, wherein said control circuit section comprises a first transistor of a first conductivity type in which one end of a current path is connected to a first potential supply source; and second transistor of a second conductivity type in which one end of a current path is connected to the other end of the current path of the first transistor, the other end of the current path is connected to a second potential supply source and a gate receives the control voltage; and said 3-input NAND gate section comprises a third transistor of the first conductivity type in which one end of a current path is connected to the first potential supply source and a gate connected to the gate and the other end of the current path of the first transistor; a fourth transistor of the first conductivity type in which one end of a current path is connected to the other end of the current path of the third transistor and a gate receives a first input signal; a fifth transistor of the first conductivity type in which one end of a current path is connected to the other end of the current path of the third transistor, the other end of the current path is connected to the other end of the current path of the forth transistor and gate receives a second input signal; a sixth transistor of the first conductivity type in which one end of a current path is connected to the first potential supply source, the other end of the current path is connected to the other end of the current path of the forth transistor and gate receives a third input signal; a seventh transistor of the second conductivity type in which one end of a current path is connected to the other end of the current path of the fourth transistor and a gate receives the first input signal; and an eighth transistor of the second conductivity type in which one end of a current path is connected to the other end of the current path of the seventh transistor and gate receives the second input signal; a ninth transistor of the second conductivity type in which one end of a current path is connected to the other end of the current path of the eighth transistor and a gate is connected to the gate of the second transistor; a tenth transistor in which one end of a current path is connected to the other end of the current path of ninth transistor, the other end of the current path is connected to the second potential supply source and a gate receives the third input signal;

and outputs the output signal from a connecting point between the fourth, fifth, sixth and seventh transistors.

13. The voltage controlled oscillator according to claim 10, wherein each of the circuits whose operation delay time is controlled by the control voltage includes a control circuit section for outputting first and second internal control voltages according to the control voltage and a 3-input NOR gate section in which a current is controlled by the first and second internal control voltages output from said control circuit section.

14. The voltage controlled oscillator according to claim 13, wherein said control circuit section comprises a first transistor of a first conductivity type in which one end of a current path is connected to a first potential supply source; and second transistor of a second conductivity type in which one end of a current path is connected to the other end of the current path of the first transistor, the other end of the current path is connected to a second potential supply source and a gate receives the control voltage; and said 3-input NOR gate section comprises a third transistor of the first conductivity type in which one end of a current path is connected to the first potential supply source and a gate connected to the gate and the other end of the current path of the first transistor; a fourth transistor of the first conductivity type in which one end of a current path is connected to the other end of the current path of the third transistor and a gate receives a third input signal; a fifth transistor of the first conductivity type in which one end of a current path is connected to the other end of the current path of the fourth transistor and gate receives a second input signal; a sixth transistor of the first conductivity type in which one end of a current path is connected to the other end of the current path of the fifth transistor and a gate receives a first input signal; a seventh transistor of the second conductivity type in which one end of a current path is connected to the other end of the current path of sixth transistor and a gate receives the first input signal, an eighth transistor of the second conductivity type in which one end of a current path is connected to the other end of the current path of the sixth transistor, the other end of the current path is connected to the other end of the current path of the seventh transistor and a gate receives the second input signal; a ninth transistor of the second conductivity type in which one end of a current path is connected to the other end of the current path of the sixth transistor, the other end of the current path is connected to the second potential supply source and a gate receives the third input signal; a tenth transistor in which one end of a current path is connected to the other and of the current path of the seventh transistor, the other end of the current path is connected to the second potential supply source and a gate is connected to the gate of the second transistor;

and outputs the output signal from a connecting point between the sixth, seventh, eighth and ninth transistors.

15. The voltage controlled oscillator according to claim 10, wherein said voltage controlled delay circuit is a 3-input NAND gate having first and second input terminals supplied with a power supply voltage and a third input terminal supplied with the output signal of said voltage controlled delay circuit in the preceding-stage one of said unit circuits.

16. The voltage controlled oscillator according to claim 10, wherein said voltage controlled delay circuit is a 3-input NOR gate having first and second input terminals connected to a ground node and a third input terminal supplied with the output signal of said voltage controlled delay circuit in the preceding-stage one of said unit circuits.

17. The voltage controlled oscillator according to claim 10, wherein said selection circuit is a 3-input NAND gate having a first input terminal supplied with the output signal of said voltage controlled delay circuit, a second input terminal supplied with the respective selection signal and a third input terminal applied with a fixed potential.

18. The voltage controlled oscillator according to claim 10, wherein said selection circuit is a 3-input NOR gate having a first input terminal supplied with the output signal of said voltage controlled delay circuit, a second input terminal supplied with the respective selection signal and a third input terminal applied with a fixed potential.

19. The voltage controlled oscillator according to claim 10, wherein said adder circuit is a 3-input NAND gate having a first input terminal supplied with the output signal of said selection circuit, a second input terminal supplied with the feedback signal from the adder circuit in a next-stage one of said unit circuits and a third input terminal supplied with an inverted signal of the respective selection signal supplied to a preceding-stage one of said unit circuits.

20. The voltage controlled oscillator according to claim 10, wherein said adder circuit is a 3-input NOR gate having a first input terminal supplied with the output signal of said selection circuit, a second input terminal supplied with the feedback signal from the adder circuit in a next-stage one of said unit circuits and a third input terminal supplied with an inverted signal of the respective selection signal supplied to a preceding-stage one of said unit circuits.

* * * * *